(12) United States Patent
Mendel

(10) Patent No.: US 8,384,488 B2
(45) Date of Patent: Feb. 26, 2013

(54) PHASE-LOCK IN ALL-DIGITAL PHASE-LOCKED LOOPS

(75) Inventor: Stefan Mendel, Graz (AT)

(73) Assignee: Intel Mobile Communications GmbH, Neubiberg (DE)

( * ) Notice: Subject to any disclaimer, the term of this patent is extended or adjusted under 35 U.S.C. 154(b) by 0 days.

(21) Appl. No.: 12/575,196

(22) Filed: Oct. 7, 2009

(65) Prior Publication Data
US 2011/0081863 A1    Apr. 7, 2011

(51) Int. Cl.
*H03B 5/12*    (2006.01)

(52) U.S. Cl. ............................ 331/179; 331/1 A; 331/16

(58) Field of Classification Search .................... 331/16, 331/1 A, 179
See application file for complete search history.

(56) References Cited

U.S. PATENT DOCUMENTS

| 7,046,098 B2 * | 5/2006 | Staszewski ................... 331/158 |
| 2006/0256910 A1 | 11/2006 | Tal et al. |

* cited by examiner

*Primary Examiner* — Arnold Kinkead
(74) *Attorney, Agent, or Firm* — SpryIP, LLC

(57) ABSTRACT

This disclosure relates to an all digital phase-lock loop (AD-PLL). The ADPLL determines an error generated by a digitally controlled oscillator (DCO) which is operated using a tuning word, stores information related to the error, and compensates for the error based on the stored information.

14 Claims, 10 Drawing Sheets

PHASE-LOCK IN ALL-DIGITAL PHASE-LOCKED LOOPS

BACKGROUND

Phase locked loops (PLL) are control systems that generate signals having a fixed relation to the phase of a reference signal. Typically, a phase-locked loop circuit responds to both the frequency and the phase of input signals, raising or lowering the frequency of a controlled oscillator until an oscillator signal is matched with a reference signal in both frequency and phase. Phase-locked loops are widely used in radio, telecommunications, computers, and other electronic applications.

The use of "all-digital phase locked loops" or ADPLLs is becoming popular. An ADPLL may include the advantages of digital circuits, such as lower power consumption, flexibility, better noise immunity, capability of digital signal processing, and so on. A typical ADPLL may include a phase detector, a loop filter, and a digitally controlled oscillator (DCO).

The DCO produces a signal with a variable frequency. Generally, the input to the DCO is a digital tuning word that controls the variable output frequency. Frequency-lock is obtained by using a correct digital tuning word. However, the phases of the reference signal and the DCO output variable signal differ and have to be laboriously adapted in order to achieve phase-lock. This lengthy process contravenes the strict operating standard when hopping frequencies in Multi Band Orthogonal Frequency Division Multiplexing Ultra Wide Band (MB-OFDM-UWB).

In MB-OFDM-UWB, the PLL has to be able to produce a wide spectrum of frequencies. For example, FIG. 1 depicts five band groups. Within a single band group 102, the carrier hops between three frequency bands (104, 106 and 108). These three frequency bands (104, 106, and 108) can be separated by of 528 MHz or 1056 MHz for example.

FIG. 2 depicts a time-frequency allocation for frequency bands (104, 106, and 108). As depicted, the Y-axis represents the frequency (MHz) and the X-axis represents time. Symbol 202 corresponds to a frequency band 104 and, as time progresses, the frequency changes between each frequency band in a band group. For example, as depicted the frequency band 104 (symbol 202) hops to frequency band 106 (symbol 204), which hops to frequency band 108 (symbol 206), which hops back to frequency band 104 (symbol 208) and so forth. Each symbol (202, 204, 206 and 208) is about 312.5 nano seconds (ns), the bands being changed within, for example, a 9.5 ns hopping duration 210. Therefore, as seen in FIG. 2, a broadband frequency synthesizer has to be able to accomplish large frequency hops within an extremely short period of time (e.g. 9.5 ns). Furthermore, the time 212 between a reoccurrence of a given frequency band (e.g. 104) is also fairly short.

One conventional approach uses three PLLs, one PLL for each band within a frequency band group (i.e. FIGS. 1 104, 106 and 108). However, this requires increased space and power consumption for the transmitting or receiving device. Another conventional approach uses a single PLL in combination with mixers to generate a frequency band group. However, mixers introduce severe spurs that impair the quality of the frequency signal. Therefore, a solution with only one fast-hopping PLL (preferably an ADPLL) would have corresponding advantages. However, in order for an ADPLL to accomplish large frequency hops within an extremely short period of time (e.g. 9.5 ns); the ADPLL must be able to achieve immediate phase-lock.

Another conventional approach operates an ADPLL in an open loop mode of operation. The open loop mode of operation is eventually closed in order to calibrate a digital tuning word for a certain frequency. During transmission, the digital tuning word is continuously loaded for a given frequency band and the DCO is controlled without feedback in the open loop mode of operation. Thus, for the given frequency band, the same digital tuning word is used over and over again with no feedback in the open loop mode of operation. Moreover, the DCO is subjected to temperature variation and voltage drifting, thereby introducing an error in the output frequency signal. This conventional approach is unable to compensate for this error because it continuously operates in an open loop mode of operation. To correct for this error associated with the DCO, this approach requires waiting for transmission pauses in order to perform a calibration. Furthermore, the quality of synthesized frequencies in this approach cannot be guaranteed by the open loop mode of operation.

BRIEF DESCRIPTION OF THE DRAWINGS

The detailed description is described with reference to the accompanying figures. In the figures, the left-most digit(s) of a reference number identifies the figure in which the reference number first appears. The same numbers are used throughout the drawings to reference like features and components.

DETAILED DESCRIPTION

This disclosure is directed towards techniques and methods for achieving rapid or immediate phase-lock using an all digital phase locked loop or ADPLL. The ADPLL may be implemented in wireless communication systems, Bluetooth devices, ultra wideband devices, and so on.

The ADPLL may generally include a phase detector, a loop filter, a digitally controlled oscillator (DCO), and a feedback path utilized in a closed loop mode of operation. The phase detector compares phases of a reference phase signal with a variable feedback phase signal, and generates a phase error signal. The loop filter stabilizes the loop and filters the phase error signal of the phase detector. The DCO may generate a range of frequencies from a plurality of stored digital tuning words.

Figure 1:
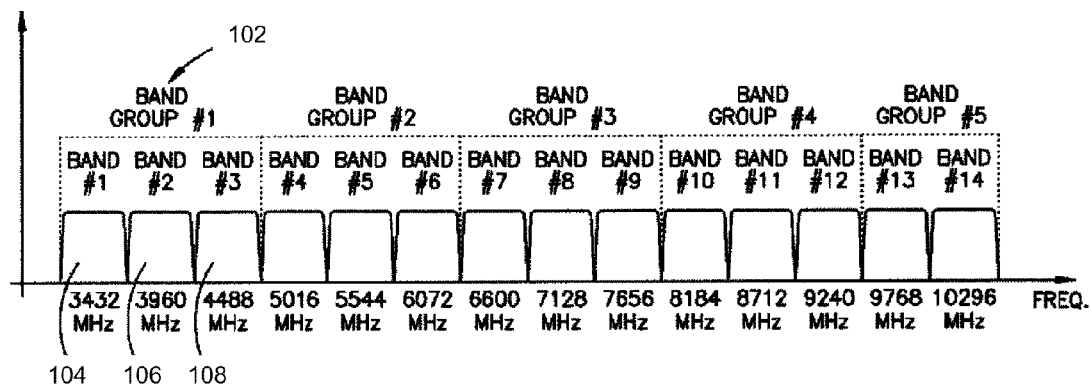
FIG. 1 depicts five MB-OFDM-UWB frequency band groups.
Figure 2:
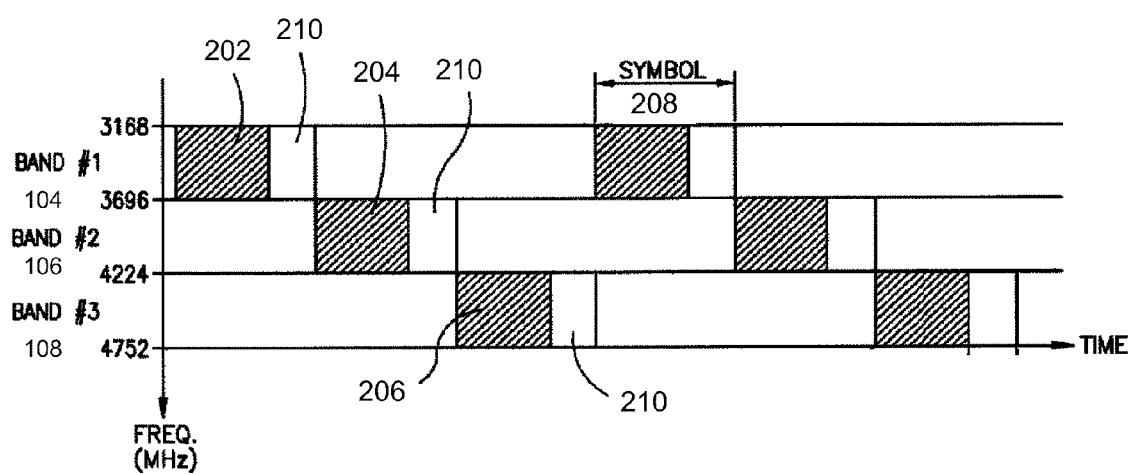
FIG. 2 depicts a typical time-frequency allocation for a band group.

The digital tuning word may be configured to be set in accordance with the frequency bands and the frequency hopping discussed in relation to FIG. 1 and FIG. 2. The variable frequency signal output by the DCO is fed back to the phase detector through the feedback path. Phase-lock is achieved using the ADPLL by determining the phase error in a closed loop mode of operation and compensating for the determined phase error. Once the phase error is determined, the digital tuning word for a particular frequency band may be updated. This process may be repeated each ADPLL loop cycle. The updated digital tuning word may be stored for the given frequency band. In this sense, the ADPLL accommodates the phase error introduced when hopping (i.e. changing, switching) from a first frequency band to a second frequency band. Furthermore, the updated digital tuning word is stored so that when the ADPLL hops to the same frequency band again, the ADPLL will provide a more accurate digital tuning word to the DCO. Thus, no transmission pauses, or waiting periods are necessary in order to perform calibration as discussed in relation to the conventional approaches.

Figure 3:
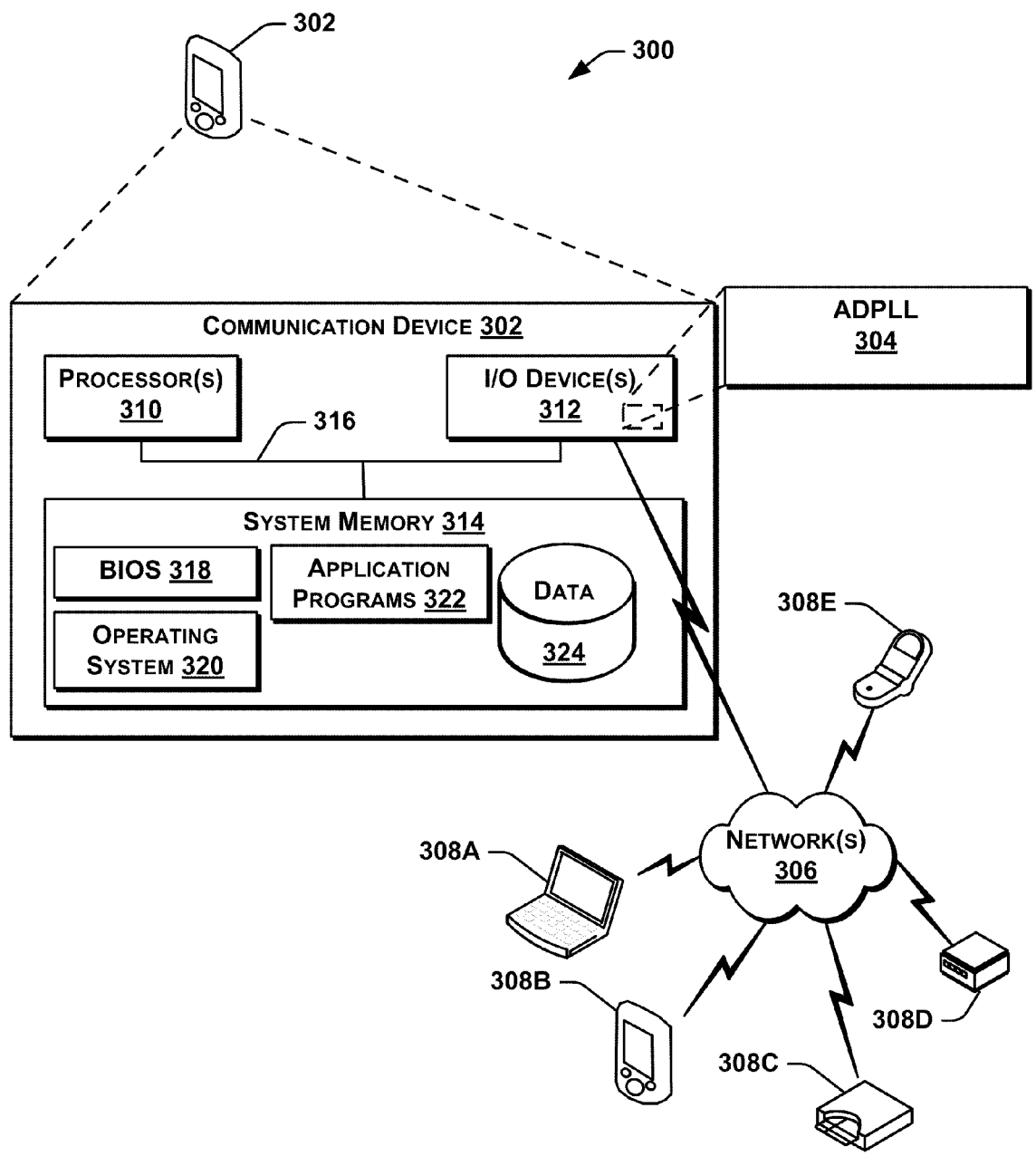
FIG. 3 depicts an exemplary environment in which techniques in accordance with the present disclosure may be implemented.

FIG. 3 illustrates an exemplary environment 300 in which techniques in accordance with the present disclosure may be implemented. For example, environment 300 may be implemented in wireless communication systems, mobile communication systems, Bluetooth systems, and so on. In this implementation, the environment 300 includes a communication device 302, or other mobile and/or electronic device, having one or more ADPLL circuit(s) 304 configured in accordance with the teachings of the present disclosure to achieve immediate phase-lock in a closed loop mode of operation. The ADPLL circuit 304 may include components that operate to provide immediate phase-lock; however, these components are not shown for the sake of simplicity. The communication device 302 operatively communicates via one or more networks 306, such as wireless local area network (WLAN), with a plurality of other devices 308(A, B, C, D and E). Alternatively, the communication device 302 may bypass the networks 306 and communicate directly with one or more of the other devices 308(A, B, C, D and E).

In the representative environment 300, the communication device 302 is a hand-held device, such as an MP3 (Moving Picture Exerts Group Layer-3) player, a personal data assistant (PDA), a global positioning system (GPS) unit, mobile telephone, smartphone, or other similar hand-held device, and the other devices 308(A, B, C, D and E) may include, for example, a computer 308A, another hand-held device 308B, a compact disc (CD) or digital video disc (DVD) player 308C, a signal processor 308D (e.g., radio, navigational unit, television, etc.), and a mobile phone 308E. In alternate implementations, of course, the devices 302 and 308(A, B, C, D and E) may include any other suitable devices, and it is understood that any of the plurality of devices 302 and 308(A, B, C, D and E) may be equipped with ADPLL 304 that operate in accordance with the teachings of the present disclosure.

As further shown in FIG. 3, the communication device 302 includes one or more processors 310 and one or more input/output (I/O) devices 312 (e.g., transceivers, transmitters, receivers, etc.) coupled to a system memory 314 by a bus 316. In the implementation shown in FIG. 3, the ADPLL 304 is included as a component within the I/O devices 312 of the communication device 302. In alternate implementations, however, the ADPLL 304 may be integrated with any other suitable portion of the device 302, or may be a separate, individual component of the device 302.

The system bus 316 of the communication device 302 represents any of the several types of bus structures, including a memory bus or memory controller, a peripheral bus, an accelerated graphics port, and a processor or local bus using any of a variety of bus architectures. The I/O component 312 may be configured to operatively communicate with one or more external networks 306, such as a cellular telephone network, a satellite network, an information network (e.g., Internet, intranet, cellular network, cable network, fiber optic network, LAN, WAN, etc.), an infrared or radio wave communication network, or any other suitable network.

The system memory 314 may include computer-readable media configured to store data and/or program modules for implementing the techniques disclosed herein that are immediately accessible to and/or presently operated on by the processor 310. For example, the system memory 314 may also store a basic input/output system (BIOS) 318, an operating system 320, one or more application programs 322, and program data 324 that can be accessed by the processor 310 for performing various tasks desired by a user of the communication device 302.

Moreover, the computer-readable media included in the system memory 314 can be any available media that can be accessed by the device 302, including computer storage media and communication media. Computer storage media may include both volatile and nonvolatile, removable and non-removable media implemented in any method or technology for storage of information such as computer-readable instructions, data structures, program modules, or other data. Computer storage media includes, but is not limited to, and random access memory (RAM), read only memory (ROM), electrically erasable programmable ROM (EEPROM), flash memory or other memory technology, compact disk ROM (CD-ROM), digital versatile disks (DVD) or other optical disk storage, magnetic cassettes, magnetic tape, magnetic disk storage or other magnetic storage devices, or any other medium, including paper, punch cards and the like, which can be used to store the desired information and which can be accessed by the communication device 302.

Similarly, communication media typically embodies computer-readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection and wireless media such as acoustic, RF, infrared and other wireless media. Combinations of any of the above should also be included within the scope of computer readable media.

Generally, program modules executed on the device 302 may include routines, programs, objects, components, data structures, etc., for performing particular tasks or implementing particular abstract data types. These program modules and the like may be executed as a native code or may be downloaded and executed such as in a virtual machine or other just-in-time compilation execution environments. Typically, the functionality of the program modules may be combined or distributed as desired in various implementations.

Although the exemplary environment 300 is shown as in FIG. 3 as a communication network, this implementation is meant to serve only as a non-limiting example of a suitable environment for the present disclosure. Similarly, the device 302 is simply one non-limiting example of a suitable device that may include an ADPLL configured to achieve immediate phase-lock in accordance with the present disclosure.

Figure 4:
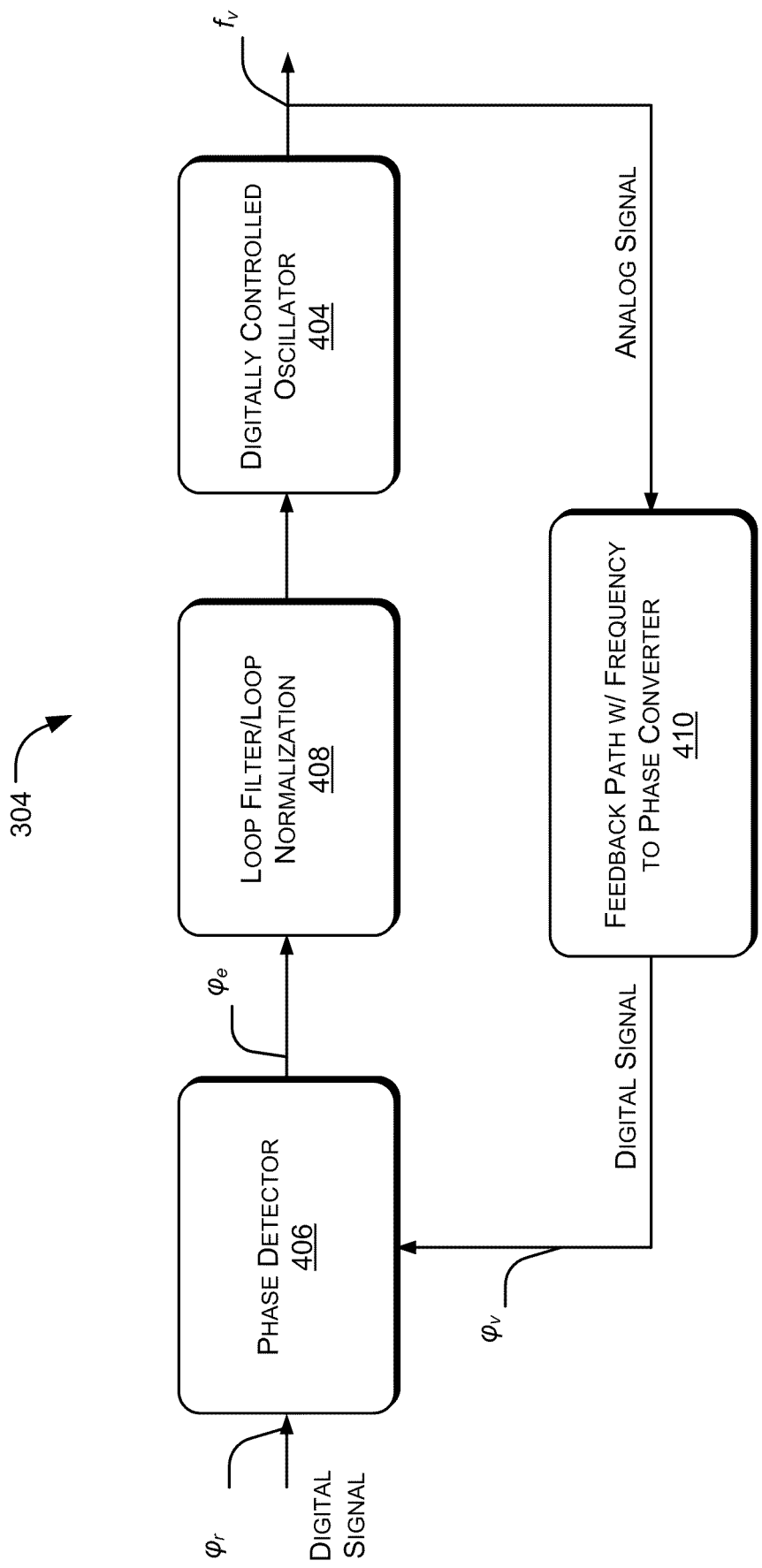
FIG. 4 is a simplified schematic diagram of one implementation of an ADPLL according to this disclosure.

FIG. 4 illustrates an exemplary ADPLL 304 configured to achieve rapid immediate phase-lock in a closed loop mode of operation. For the purpose of this disclosure the term "immediate phase lock" may also be used to refer to near-instantaneous phase-lock or rapid phase-lock. In other words, phase-lock happens in a very short amount of time, limited only by the switching of the DCO. The ADPLL 304 is a control system that generates an output frequency signal in accordance with a digital tuning word. The ADPLL 304 may automatically raise or lower the frequency of a digitally controlled oscillator (DCO) 404 based on stored digital tuning words corresponding to the frequency bands and frequency hops discussed in relation to FIG. 1 and FIG. 2. To this end, the ADPLL 304 further includes a phase detector 406, a loop filter and loop normalization 408, and a feedback path 410 including a frequency to phase converter.

In an implementation, a sampling frequency $f_{ref}$ undergoes frequency to phase conversion (not illustrated for the sake of simplicity, but understood by those skilled in the art). As a result of this conversion, a reference phase signal $\phi_r$ along with a feedback phase signal $\phi_v$, are both received at the phase detector 406. The feedback phase signal $\phi_v$ is obtained by converting a frequency signal $f_v$ generated by the DCO 404 in accordance with a digital tuning word, into a digital phase signal using the feedback path with a frequency to phase converter 410. The phase detector 406 may be digital logic that generates an error phase signal $\phi_e$, which represents the difference in phase between the digital reference phase signal $\phi_r$ and the digital feedback phase signal $\phi_v$. For further understanding with regard to this disclosure, FIG. 4 indicates that the variable frequency signal $f_v$ provided to the feedback path with a frequency to phase converter 410 is an analog signal, while a reference phase signal $\phi_r$ along with a feedback phase signal $\phi_v$ are digital signals.

Figure 5:
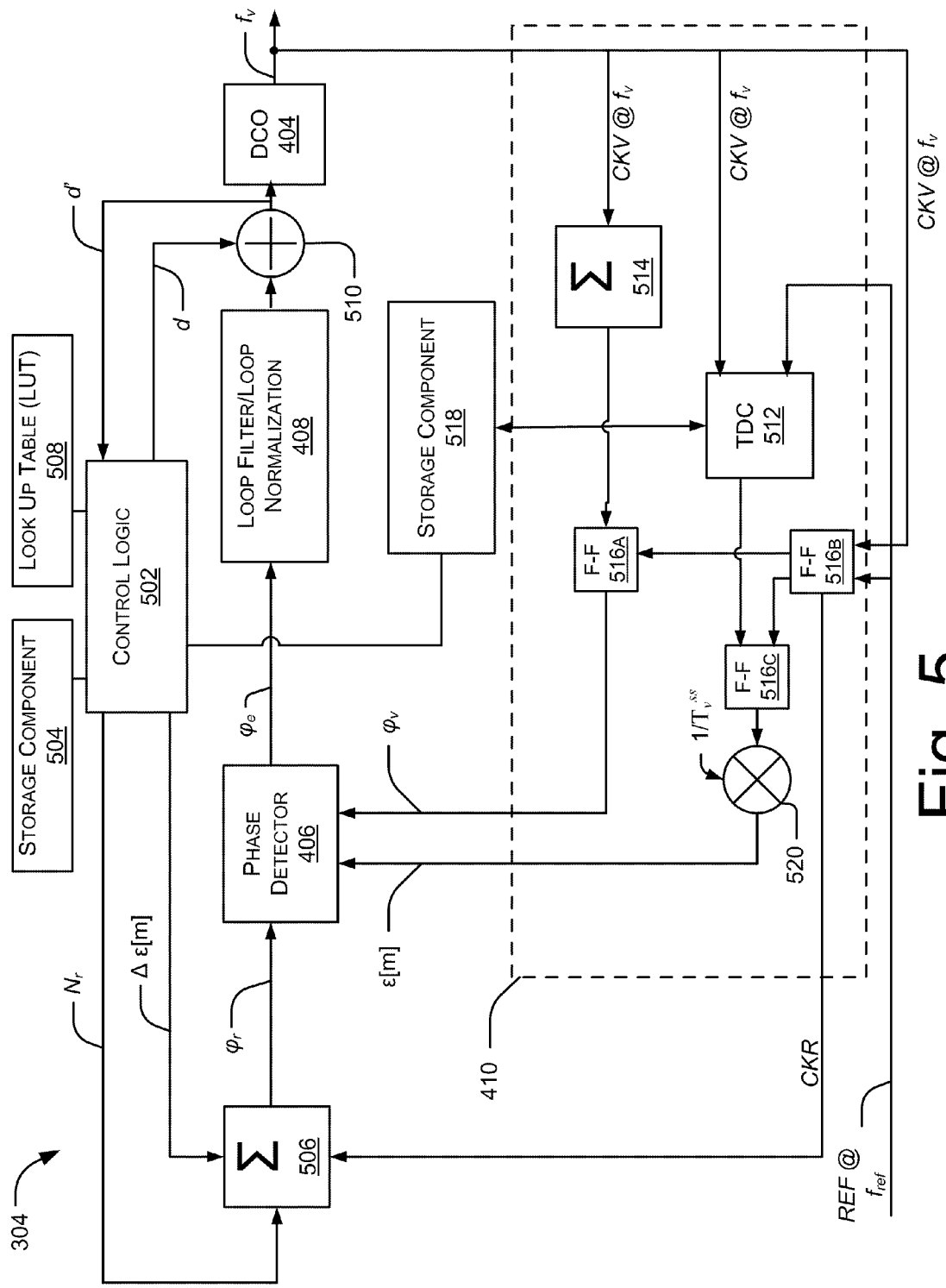
FIG. 5 is another simplified schematic diagram of one implementation of an ADPLL according to this disclosure.

FIG. 5 illustrates an exemplary ADPLL 304 in greater detail. The feedback path 410 converts the DCO generated frequency signal $f_v$ into the digital feedback phase signal $\phi_v$ to be compared with the digital reference signal $\phi_r$ at the phase detector 406. The feedback path 410 is implemented in ADPLL 304 to address temperature variation, voltage drifting, and noise in the generated frequency signal $f_v$. According to this disclosure, when immediate phase lock is achieved, the error phase signal $\phi_e$ should equal zero or be relatively close to zero for a type-II ADPLL. Immediate phase lock is achieved because the feedback path 410 determines a phase error introduced when the DCO is operated in accordance with a frequency hop. The phase error is digitally calculated and digitally compensated for in a single ADPLL loop cycle and phase lock is achieved immediately. Therefore, the ADPLL does not have to perform numerous ADPLL cycles in order to obtain phase-lock.

The reference phase $\phi_r$ may be calculated by accumulating $N_r$ at the rate of the reference frequency, where $N_r$ is the frequency command word that corresponds to the ratio between the variable frequency $f_v$ and reference frequency $f_{ref}$, or in other words, to the desired number of variable frequency $f_v$ periods within one digital retimed reference signal CKR cycle (discussed in further detail below in relation to FIGS. 6-8). It is to be noted that $N_r$ may be an integer or a fractional number. Control logic 502 stores frequency command word $N_r$ in storage component 504, and provides frequency command word $N_r$ to an accumulator 506 in association with a particular frequency band discussed in relation to FIG. 1 and FIG. 2.

In one embodiment, control logic 502 and storage component 504 are part of the ADPLL circuit(s) 304. In another embodiment, control logic 502 and storage component 504 are part of the communication device 310 and the ADPLL is connected to the control logic 502 and storage component 504 via the bus 316 shown in FIG. 3.

The storage component 504 stores a plurality of frequency command words $N_r$. For example, storage component 504 may store a frequency command word $N_r$ for each particular frequency band (e.g. 102, 104 and 106) discussed in relation to FIG. 1 and FIG. 2. The control logic 502 changes (i.e. provides a different) $N_r$ when the ADPLL 304 hops (i.e. switches or changes) from one frequency band to another.

Similar to the plurality of frequency command words $N_r$, storage component 504 may store a plurality of digital tuning words d for each particular frequency band (e.g. 102, 104 and 106) discussed in relation to FIG. 1 and FIG. 2. The control logic 502 changes (i.e. provides a different) the digital tuning word d when the ADPLL 304 hops (i.e. switches or changes) from one frequency band to another. Accordingly, when the ADPLL hops from a first frequency to a second frequency, control logic 502 provides a new frequency command word $N_r$ to accumulator 506, and a new digital tuning word d to operate the DCO 404. Control logic 502 may determine which digital tuning words d to provide to operate the DCO 404 via look up table (LUT) 508. LUT 508 may be coupled to the control logic 502 (as depicted in FIG. 5) or may be located in storage component 504.

Thus, the signal input to the ADPLL 304 in FIG. 5 is the frequency command word $N_r$, which defines the desired output signal of the ADPLL 304 as a multiple of a reference frequency signal $f_{ref}$ (discussed in further detail below in relation to FIG. 6 and FIG. 7), such that the desired frequency signal $f_v^{ss}$ is defined by the following equation:

$$f_v^{ss} = f_{ref} N_r \qquad (1)$$

Accumulator 506 produces the reference phase signal $\phi_r$ by accumulating the frequency command word $N_r$. The reference phase signal $\phi_r$ is fed to the phase detector 406, where the reference phase signal $\phi_r$ is compared with the digital feedback phase signal $\phi_v$.

The output of the phase detector 406 is the phase error signal $\phi_e$. The phase error signal $\phi_e$ represents the variation between the digital feedback phase signal $\phi_v$ in comparison with the reference phase signal $\phi_r$. The phase error signal $\phi_e$ may be fed to the loop filter/loop normalization block 408 as would be well understood by one skilled in the art without further explanation.

The control logic 502 determines, via LUT 508 for example, which digital tuning word d should operate the DCO 404 for a particular frequency band. The control logic 504 provides the digital tuning word d to a summation point 510. The summation point 510 then injects the digital tuning word d into the DCO 404. The DCO 404 converts the digital tuning word d into an analog variable frequency signal $f_v$. A part of the generated signal $f_v$ is fed back to the phase detector 406 via the feedback path 410.

The feedback path with the frequency to phase converter 410 converts the variable frequency signal $f_v$ into a digital feedback phase signal $\phi_v$. The feedback path 410 may convert the variable frequency signal $f_v$ into an integer phase signal and a fractional phase signal. The integer phase signal and the fractional phase signal are added up to produce $\phi_v$, as is well understood in the ADPLL art.

Furthermore, the reference signal $f_{ref}$ and the generated variable frequency signal $f_v$ in the ADPLL 304 may be different frequencies and their rising edges may not be synchronized. Accordingly, the generated frequency signal $f_v$ along with the reference signal $f_{ref}$ may be fed to a time to digital converter (TDC) 512. The TDC 512 may be implemented in different forms, for example, one implementation uses an array of inverters with one inverter delay as a quantization step. Furthermore, generated frequency signal $f_v$ may be provided to an accumulator 514 and Flip-Flop 516A and 516B. Reference signal $f_{ref}$ may also be provided to Flip-Flop 516B. Flip-Flop 516B produces retimed digital reference clock CKR.

Thus, using the exemplary implementation in FIG. 5, there are, generally speaking, three clock signals: the uniform reference clock REF @ $f_{ref}$ (index n), the DCO output clock CKV @ $f_v$ (index i), and the retimed digital reference clock CKR (time index m). The retimed digital reference clock CKR synchronizes the REF clock domain and the CKV clock domain. The retimed reference clock CKR is non-uniform and, thus introduces a retiming error $\epsilon[m]$ as illustrated in FIG. 5.

The TDC 512 is configured to measure retiming error $\epsilon[m]$. For each ADPLL feedback loop cycle, the TDC 512 can store the retiming error $\epsilon[m]$ in an associated storage component 518. In one embodiment, storage component 518 and storage component 504 may be separate storage components associated with the ADPLL circuit. In another embodiment, storage component 518 and storage component 504 may be the same storage component or maybe connected. The TDC 512 measures the time between the rising edge of the reference clock REF and the next rising edge of the CKV clock. The TDC output is then fed to Flip-Flop 516C and multiplier 520. At multiplier 520, the time quantity is normalized by the period of the variable frequency signal $f_v$ (i.e. $T_v^{ss}$).

In the event of a frequency hop to a particular frequency band (e.g. switching frequency bands as discussed in relation to FIG. 1 and FIG. 2), the control logic 502 may simply determine a digital tuning word d corresponding to the particular frequency band. It is assumed that the injected digital tuning word d used to operate the DCO 404 correctly produces the desired frequency corresponding to the particular frequency band. However, as previously discussed, the DCO is subjected to temperature variation, voltage drifting and noise. Furthermore, a change in frequency introduces a new phase error when changing (i.e. hopping or switching) from a first frequency to a second frequency, and thus phase lock is lost. This introduced phase error may be determined in the feedback loop 410 and compensated for in the ADPLL 304 in order to achieve immediate phase-lock.

Figure 6:
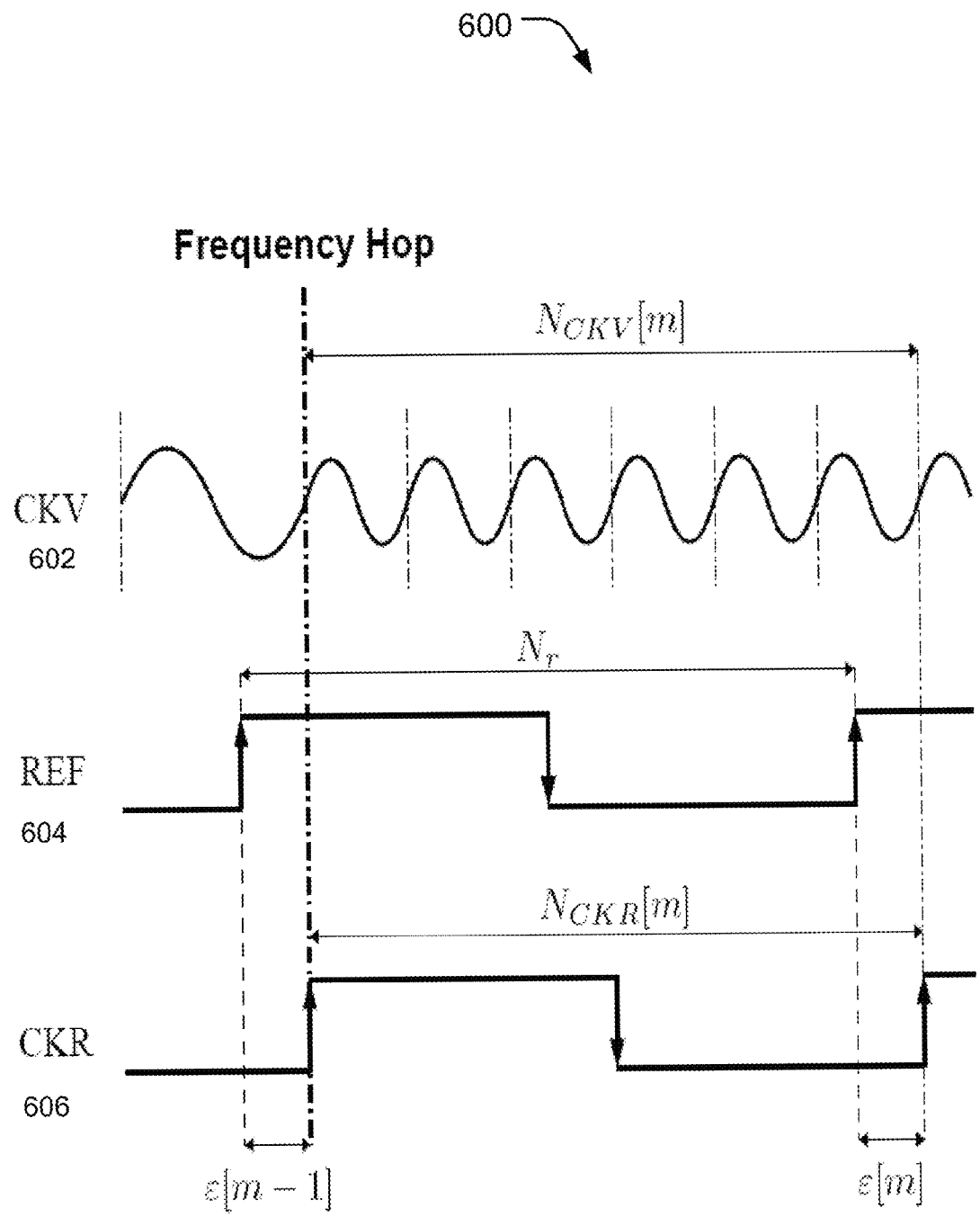
FIG. 6 is a timing diagram associated with an ADPPL according to this disclosure.

FIG. 6 depicts a timing diagram 600 showing the synchronization of CKV 602 and REF 604 via the retimed digital reference clock CKR. In FIG. 6, $N_{ckv}[m]$ is the actual number of variable frequency $f_v$ cycles within one retimed digital reference signal CKR 606 cycle. As previously discussed, the frequency command word $N_r$ is the number of desired variable frequency $f_v$ cycles within one retimed digital reference signal CKR 606 cycle. Since the retimed digital reference signal CKR 606 is non-uniform and introduces an error, $N_{CKR}[m]$ is accumulated instead of $N_r$, where $N_{CKR}[m]$ is the desired number of CKV cycles within one retimed digital reference cycle CKR. Due to the retiming, one CKV cycle is extended by $\epsilon[m]$ but shortened by $\epsilon[m-1]$. Accordingly, accumulator 506 (or its output signal) may be expressed using the following equation:

$$\phi_r[m] = \phi_r[m-1] + N_r, \quad (2)$$

the feedback accumulator 514 (or its output signal) may be expressed using the equation:

$$\phi_v[m] = \phi_v[m-1] + N_{CKV}[m], \quad (3)$$

Where the value $N_{CKV}[m]$ is the actual number of CKV cycles within a retimed reference cycle. The feedback accumulator 514 increases by the $N_{CKV}[m]$ in the mth CKR cycle. The retimed reference phase signal may be expressed using the equation:

$$\phi_{CKR}[m] = \phi_{CKR}[m-1] + N_{CKR}[m], \quad (4)$$

Thus, as implemented in FIG. 5, control logic 502 can compute:

$$\phi_{CKR}[m] = \phi_r[m] + \epsilon[m]. \quad (5)$$

As previously discussed, the TDC 512 measures and stores a retiming error $\epsilon[m]$ for each retimed digital reference signal CKR 606 cycle. The retiming error $\epsilon[m]$ is measured and calculated by:

$$\epsilon[m] = t_\epsilon[m] / T_v^{ss}[k] \quad (6)$$

where $t_\epsilon[m]$ is the measured time between a rising edge of the digital reference clock 604 and the next rising edge of the variable frequency $f_v$ 602, $T_v^{ss}[k]$ is the variable period in steady-state (i.e. $1/f_v^{ss}[k]$), and k is equal to the frequency band index associated with the frequency hopping discussed in relation to FIG. 1 and FIG. 2. For example, using FIG. 2, k could correspond to the first band 104, k+1 could correspond to the second band 106, and so forth. Looking at equation (6) above, one can discern that the retiming error $\epsilon[m]$ depends on the variable frequency $f_v$ 602, and thus changing the variable frequency $f_v$ 602 (e.g. when frequency hopping) affects the retiming.

As a result of the normalization to $T_v$, in the case of a frequency change the stored value of $\epsilon[m-1]$ (e.g. the previous CKR cycle stored in storage component 518) is incorrect because the "old" variable frequency is not the same as the "new" variable frequency. However, the values of $T_v[m-1]$ (i.e. the old variable frequency period) and $T_v[m]$ (the new variable frequency period) are known due to the variable frequency generated by the DCO in response to a change in the stored digital tuning words, and $\epsilon[m-1]$ has been previously measured by the TDC 512 and stored in storage component 518. Therefore, using the known values of $T_v[m-1]$, $T_v[m]$ and $\epsilon[m-1]$ the control logic 502 can digitally compensate for the introduced phase error. Accordingly, the phase error introduced with each hop is equal to:

$$\Delta\epsilon[m] = (t_\epsilon[m-1]/T_v^{ss}[k]) - (t_\epsilon[m-1]/T_v^{ss}[k+1]) \quad (7)$$

Here, $(t_\epsilon[m-1]/T_v^{ss}[k]) = \epsilon[m-1]$, which is the retiming error stored in the storage component 518, and $(t_\epsilon[m-1]/T_v^{ss}[k+1])$ represents the desired retiming error. Thus, the error can be digitally compensated on the basis of modifying the reference phase:

$$\phi_r[m] = \phi_r[m] + \Delta\epsilon[m] \quad (8)$$

The addition of $\Delta\epsilon[m]$ to $\phi_r[m]$ is illustrated in FIG. 5 at the accumulator 506. The control logic 502 digitally calculates $\Delta\epsilon[m]$ based on the TDC measurements and adjusts $\phi_r[m]$ in a closed loop mode of operation. Furthermore, the control logic 502 may update a state of the ADPLL for a particular frequency band. The state of the ADPLL refers to one or more values associated with the particular frequency band, which are stored in storage component 504 and/or storage component 518. Specifically, $\Delta\epsilon[m]$ may be used to update the digital tuning word for the particular frequency band and store the updated digital tuning word, for example in LUT 508 and/or storage component 504. The updated digital tuning word d' is depicted in FIG. 5 as being provided back to the control logic 502. In this sense, the ADPLL continuously updates and restores the state of an ADPLL for a particular frequency, thereby providing a first state, second state, third state and so on for the particular frequency band each time the digital tuning word is updated and restored.

By updating and restoring the state of an ADPLL for each frequency band, the ADPLL may be configured to provide a more accurate digital tuning word the next time the ADPLL switches (e.g. hops) to the same frequency band as illustrated in FIG. 2, for example. Thus, the ADPLL, in a closed loop mode of operation, not only accommodates a phase error introduced when switching from a first frequency to a second, different frequency, but also accommodates temperature variation and voltage drifting associated with the DCO such that desired frequency can be output more accurately. In this sense, the ADPLL is always updating the state of the ADPLL in the associated storage components 504 and 518.

However, the calculation in equation (8) may be affected by impaired measurements due to transient behavior associated with the DCO. The DCO 404 is typically an LC oscillator including an inductor ("L") and a capacitor ("C") connected in parallel. An LC oscillator cannot switch from a first frequency to a second frequency instantaneously. Therefore, when the ADPLL performs large frequency hops (e.g. 1056 MHz as discussed in relation to the MB-OFDM-UWB in FIG. 1 and FIG. 2) the DCO is subjected to transient behavior. FIG. 7 depicts a timing diagram 700 illustrating a period of DCO transient behavior at 702. In order to overcome these impaired measurements, two techniques are proposed. These techniques perform digital computations to address the DCO transient behavior.

The first technique addressing the DCO transient behavior employs an open loop cycle prior to closing the loop of the ADPLL 304. In response to a frequency hop (e.g. 702), the ADPLL 304 uses the same stored tuning word d for the first and second ADPLL cycle after the frequency hop. During the first cycle, the TDC 512 measures $\epsilon[m]$. However, the ADPLL 304 does not update the stored tuning word. After the first ADPLL cycle, the phase signals are adjusted using:

$$N_{CKR}[m]=N_r[k]+\epsilon[m]-\epsilon[m-1], \quad (9)$$

in the second cycle after a frequency hop such that:

$$\phi_e[m]=N_e[m]=N_{CKR}[m]-N_{CKV}[m], \quad (10)$$

where:

$$N_{CKV}[m]=\phi_v[m]-\phi_v[m-1]. \quad (11)$$

One way to do this is by setting:

$$\phi_r[m]=\phi_v[m-1]-\epsilon[m-1]+N_r[k], \quad (12)$$

such that the phase error becomes:

$$\phi_e[m]=\phi_r[m]-\phi_v[m]+\epsilon[m]=\phi_v[m-1]-\epsilon[m-1]+N_r[k]-\phi_v[m]+\epsilon[m]=N_e[m]. \quad (13)$$

The second technique addressing the DCO transient behavior comprises a process that remains in a closed loop mode of operation. Therefore, no open loop cycle is necessary. This technique accommodates a measurement in the first cycle of the closed loop that would otherwise be impaired by the transient behavior of the DCO by using a modified measurement that is not impaired by the transient behavior during the first cycle after the frequency hop. For example, this technique may use a latter portion of the CKR cycle, such as the second half or last third portion of the CKR cycle for the measurement. This is depicted in FIG. 7 at 704 where the values are divided by two. Using the second technique, the digital tuning word d' can be updated and restored as depicted in relation to FIG. 5.

Figure 7:
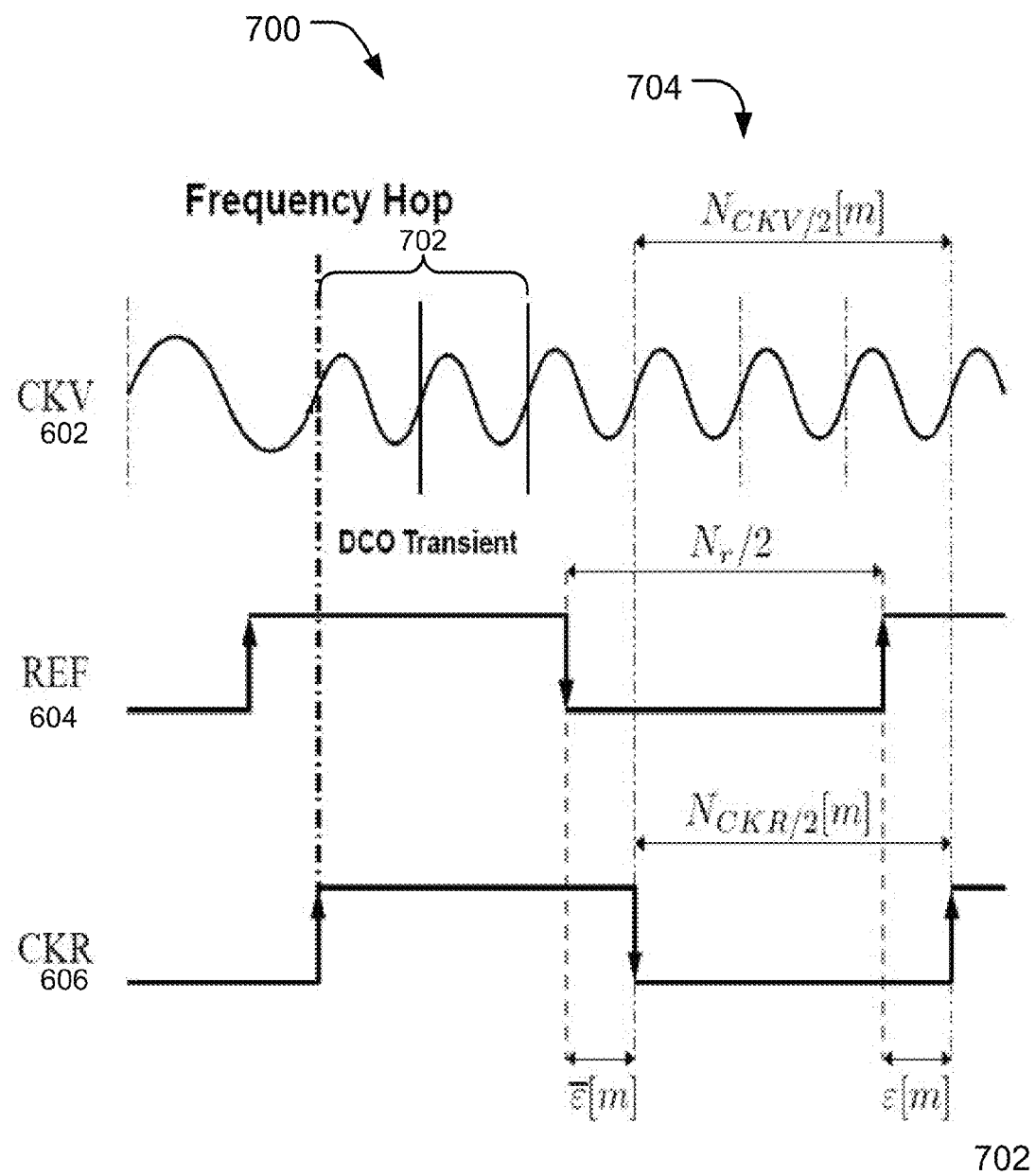
FIG. 7 is another timing diagram associated with an ADPPL according to this disclosure.

The second technique measures $\epsilon[m]$ and $\bar{\epsilon}[m]$ in the first cycle after a frequency hop as illustrated in FIG. 7. As depicted, $\bar{\epsilon}[m]$ is measured with reference to the falling edge of the REF clock 604 and the next falling edge of the retimed digital reference clock CKR 606. Note the value $\epsilon[m-1]$ is not used in this technique. Based on these measurements, the ADPLL 304 may adjust the phase signals in the second cycle after a frequency hop using:

$$N_{CKR/2}[m]=N_r[k]/2+\epsilon[m]-\bar{\epsilon}[m], \quad (14)$$

such that:

$$\phi_e[m]=N_{e/2}[m]=N_{CKR/2}[m]-N_{CKV/2}[m], \quad (15)$$

and:

$$N_{CKV}[m]=\phi_v[m]-\overline{\phi_v}[m], \text{ and} \quad (16)$$

where $\overline{\phi_v}[m]$ is the feedback accumulator value sampled with the falling edge of CKR. According to one implementation $\phi_r[m]$ is determined by:

$$\phi_r[m]=\overline{\phi_v}[m]-\bar{\epsilon}[m]+N_r[k]/2, \quad (17)$$

such that the phase error becomes:

$$\phi_e[m]=\phi_r[m]-\phi_v[m]+\epsilon[m]= \\ \overline{\phi_v}[m]-\bar{\epsilon}[m]+N_r[k]/2-\phi_v[m]+\epsilon[m]=N_{e/2}[m]. \quad (18)$$

Figure 8:
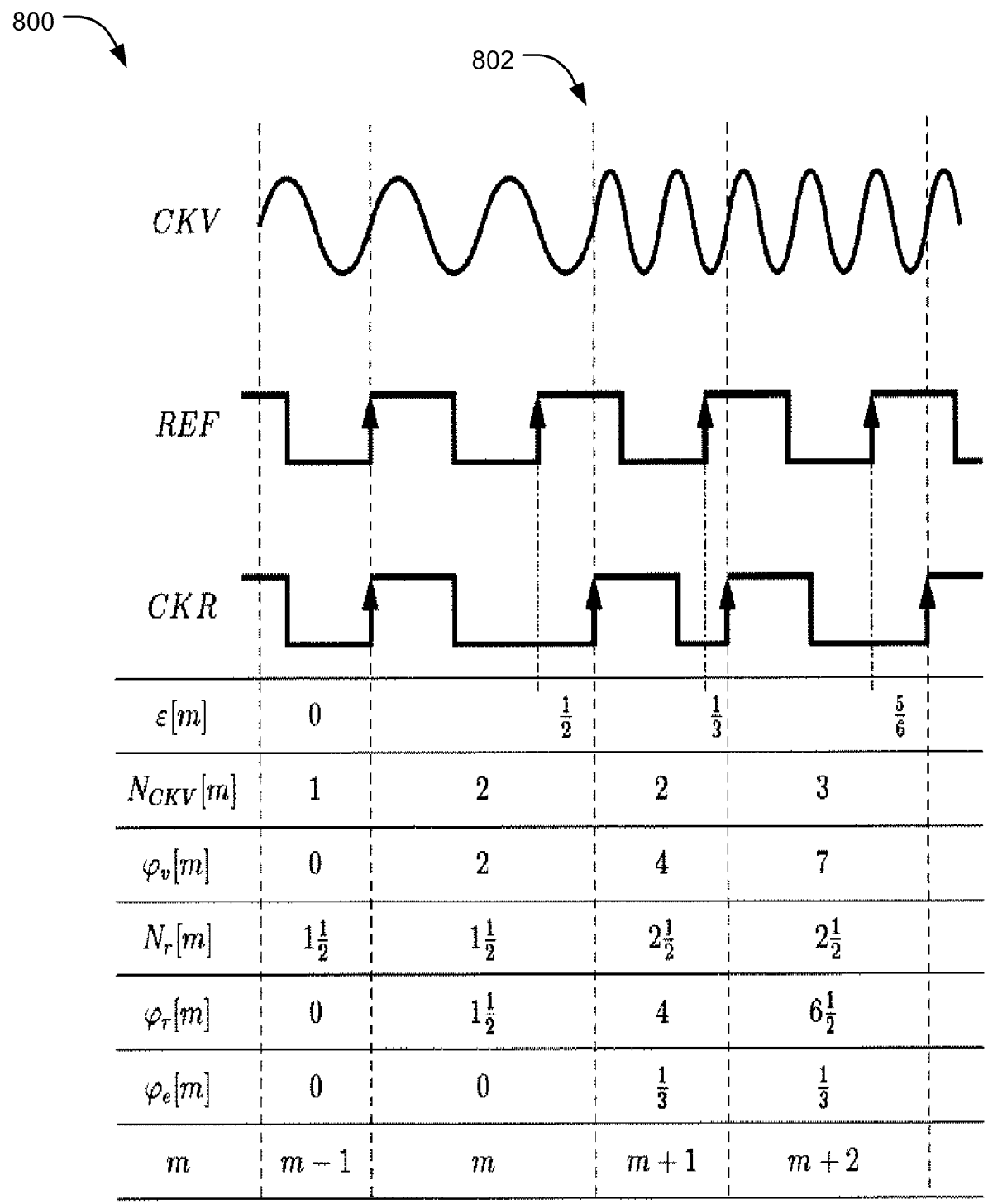
FIG. 8 is yet another timing diagram associated with an ADPPL according to this disclosure.

FIG. 8 illustrates an exemplary timing diagram 800 of the ADPLL 304. The timing diagram 800 shows the relation between various signals generated in the ADPLL 304 at various stages (e.g. various reference cycles, change in frequencies, etc.). The timing diagram 800 may be used to describe the operation of the ADPLL 304. In the timing diagram 800, the variable frequency f, hops from a first frequency to a second frequency as indicated by the dotted line at 802. Accordingly, a phase error $\phi_e$ is introduced when the frequency command word $N_r$ is changed from 1.5 to 2.5 in accordance with the variable frequency $f_v$ hop 802.

FIG. 8 further illustrates the retiming error $\epsilon[m]$, $N_{ckv}$, feedback phase signal $\phi_v$, reference phase signal $\phi_r$ and CKR cycle index m as previously discussed.

Exemplary Methods

Figure 9:
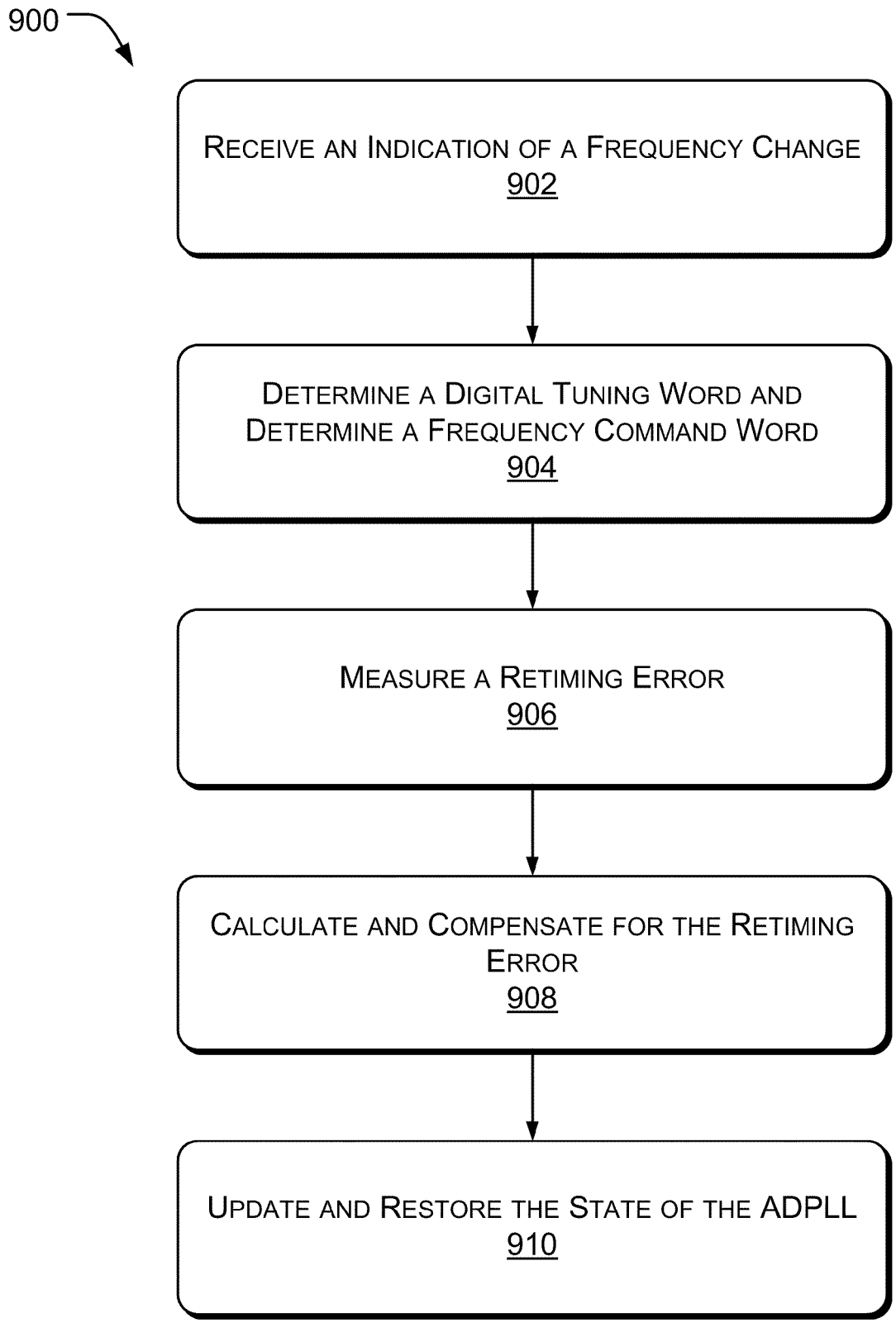
FIG. 9 is a flowchart illustrating an exemplary process that uses an ADPLL to achieve phase lock according to this disclosure.

FIG. 9 illustrates an exemplary method 900 to achieve immediate phase lock and update the state of the ADPLL for a particular frequency band. In one implementation, the exemplary method 900 can be implemented in the ADPLL 304, and any circuit components connected to the ADPLL 304. The exemplary method 900 is described with reference to FIGS. 1-8. The order in which these methods are described is not intended to be construed as a limitation, and any number of the described method blocks can be combined in any order to implement the methods, or alternate methods. Additionally, individual blocks may be deleted from the methods without departing from the spirit and scope of the subject matter described herein. Furthermore, the methods can be implemented in any suitable hardware, software, firmware, or a combination thereof, without departing from the scope of this disclosure.

At block 902, control logic 502 receives an indication of a frequency change in a communication or transmission. At this point, the ADPLL needs to hop or switch from a first frequency band (e.g. an "old" frequency) to a second frequency band (e.g. a "new" frequency) in accordance with the discussion related to FIG. 1 and FIG. 2.

At block 904, control logic 502 determines a digital tuning word d via the LUT 508, for example. The digital tuning word d provided by the control logic is injected (i.e. loaded) to operate the DCO 404 as depicted in FIG. 5, thereby controlling the DCO 404 to output a variable frequency signal $f_v$ associated with the second frequency band. The control logic determines the digital tuning word in correspondence to the frequency change, or in other words, the control logic associates the digital tuning word with the second frequency band that has been "hopped to" as discussed in relation to FIG. 1 and FIG. 2.

In addition to determining the digital tuning word d associated with the second frequency band at block 804, the control logic 502 may also determine and provide a corresponding frequency command word $N_r$ to the reference path as previously discussed in relation to FIG. 4 and FIG. 5.

At block 906, the TDC 512 measures a retiming error $\epsilon[m]$ in the feedback path 410. The TDC then stores the retiming error $\epsilon[m]$ in an associated storage component 518 so that the control logic 502 can calculate $\Delta\epsilon[m]$ in the ADPLL. The control logic 502 uses the retiming error to digitally calculate and digitally compensate for the introduced phase error, thereby achieving immediate phase-lock in a closed loop mode of operation. The measuring of $\epsilon[m]$ is previously discussed in relation to FIG. 5 and FIG. 6.

At block 908, the control logic 502 calculates $\Delta\epsilon[m]$ and compensates for the calculated values by providing $\Delta\epsilon[m]$ to accumulator 506, thereby adding $\Delta\epsilon[m]$ to the reference phase signal $\phi_r[m]$. With this adaptation immediate phase-lock is achieved in a closed loop mode of operation.

At block 910, the ADPLL 304 updates and restores the state with the calculated compensation $\Delta\epsilon[m]$. In one embodiment, the ADPLL 304 updates and restores the digital tuning word for the second frequency band, thereby accommodating the calculated error, so the next time the ADPLL hops to the second frequency band, the updated digital tuning word is more accurate.

Figure 10:
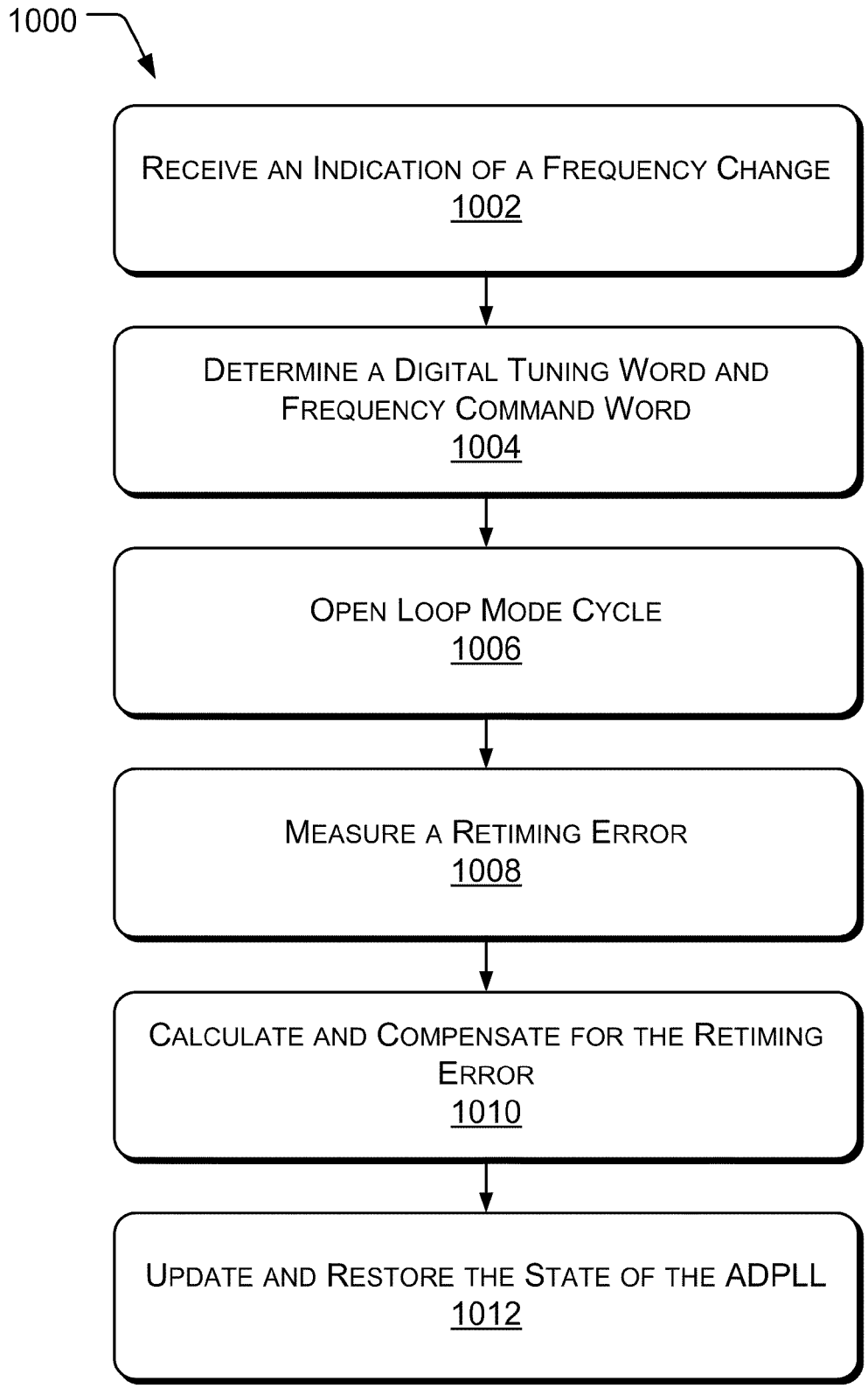
FIG. 10 is a flowchart illustrating another exemplary process that uses an ADPLL to achieve phase lock according to this disclosure.

FIG. 10 illustrates another exemplary method 1000 to achieve immediate phase lock and update the state of the ADPLL for a particular frequency band. FIG. 10 includes similar blocks as FIG. 9. However, FIG. 10 also adds an embodiment where the ADPLL 304 performs an open loop cycle as previously discussed.

At block 1002, control logic 502 receives an indication of a frequency change in a communication or transmission. At this point, the ADPLL needs to hop or switch from a first frequency band (e.g. an "old" frequency) to a second frequency band (e.g. a "new" frequency) in accordance with the discussion related to FIG. 1 and FIG. 2.

At block 1004, control logic 502 determines a digital tuning word d via the LUT 508 for example. The digital tuning word d provided by the control logic is injected (i.e. loaded) to operate the DCO 404 as depicted in FIG. 5, thereby controlling the DCO 404 to output a variable frequency signal $f_v$ associated with the second frequency band. The control logic determines the digital tuning word in correspondence to the frequency change, or in other words, the control logic associates the digital tuning word with the second frequency band that has been "hopped to" as discussed in relation to FIG. 1 and FIG. 2.

In addition to determining the digital tuning word d associated with the second frequency band at block 804, the control logic 502 may also determine and provide a corresponding frequency command word $N_r$ to the reference path as previously discussed in relation to FIG. 4 and FIG. 5.

At block 1006, the ADPLL performs a cycle in an open loop mode of operation. During this open loop cycle, the ADPLL 304 does not update the digital tuning word d. In other words, the ADPLL 304 does not update and restore the state of the second frequency band during the first cycle after the frequency hop from the first frequency band to the second frequency band. Instead, the DCO uses the same state previously measured and stored for the second frequency band. This configuration of the ADPLL accommodates the transient behavior associated with the DCO as previously discussed in relation to the first technique.

At block 1008, during the second ADPLL loop cycle after a frequency hop, the ADPLL employs the TDC 512 to measure a retiming error $\epsilon[m]$ in the feedback path 410 in a closed loop mode of operation. The TDC 512 then stores the retiming error $\epsilon[m]$ in an associated storage component 518 so that the control logic 502 can calculate $\Delta\epsilon[m]$ in the ADPLL. The control logic 502 uses the retiming error to digitally calculate and digitally compensate for the introduced phase error, thereby achieving immediate phase-lock in a closed loop mode of operation. The measuring of $\epsilon[m]$ is previously discussed in relation to FIG. 5 and FIG. 6.

At block 1010, the control logic 502 calculates $\Delta\epsilon[m]$ and compensates for the calculated values by providing $\Delta\epsilon[m]$ to accumulator 506, thereby adding $\Delta\epsilon[m]$ to the reference phase signal $\phi_r[m]$. With this adaptation immediate phase-lock is achieved in a closed loop mode of operation.

At block 1012, the ADPLL 304 updates and restores the state with the calculated compensation $\Delta\epsilon[m]$. In one embodiment, the ADPLL 304 updates and restores the digital tuning word for the second frequency band, thereby accommodating the calculated error, so the next time the ADPLL hops to the second frequency band, the updated digital tuning word is more accurate.

Figure 11:
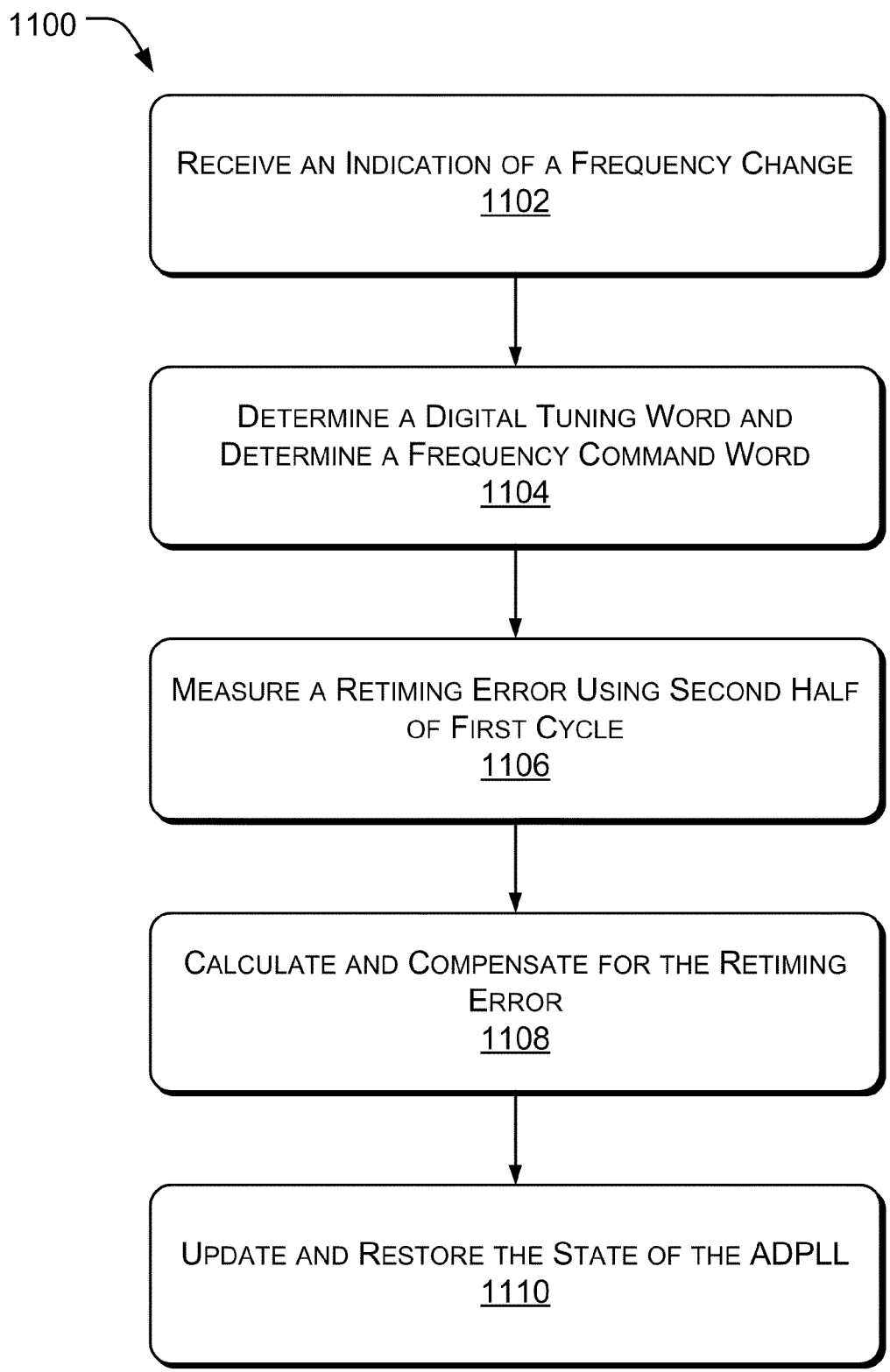
FIG. 11 is a flowchart illustrating yet another exemplary process that uses an ADPLL to achieve phase lock according to this disclosure.

FIG. 11 illustrates yet another exemplary method 1100 to achieve immediate phase lock and update the state of the ADPLL for a particular frequency band. FIG. 11 includes similar blocks as FIG. 9 and FIG. 10. However, in this implementation the ADPLL 304 only utilizes measurements provided from the second half of the first CKR cycle after a frequency hop, thereby maintaining a closed loop mode of operation as previously discussed with regard to FIG. 7.

At block 1102, control logic 502 receives an indication of a frequency change in a communication or transmission. At this point, the ADPLL needs to hop or switch from a first frequency band (e.g. an "old" frequency) to a second frequency band (e.g. a "new" frequency) in accordance with the discussion related to FIG. 1 and FIG. 2.

At block 1104, control logic 502 determines a digital tuning word d via the LUT 508 for example. The digital tuning word d provided by the control logic is injected (i.e. loaded) to operate the DCO 404 as depicted in FIG. 5, thereby controlling the DCO 404 to output a variable frequency signal $f_v$ associated with the second frequency band. The control logic determines the digital tuning word in correspondence to the frequency change, or in other words, the control logic associates the digital tuning word with the second frequency band that has been "hopped to" as discussed in relation to FIG. 1 and FIG. 2.

In addition to determining the digital tuning word d associated with the second frequency band at block 804, the control logic 502 may also determine and provide a corresponding frequency command word $N_r$ to the reference path as previously discussed in relation to FIG. 4 and FIG. 5.

At block 1106, the TDC 512 measures a retiming error $\epsilon[m]$ and $\bar{\epsilon}[m]$ in the feedback path 410 for a portion of the first cycle at the second frequency as discussed in relation to FIG. 7. The TDC 512 then stores the retiming error $\epsilon[m]$ and $\bar{\epsilon}[m]$ in an associated storage component 518 so that the control logic 502 can calculate $\Delta\epsilon[m]$ in the ADPLL. The control logic 502 uses the retiming error to digitally calculate and digitally compensate for the introduced phase error, thereby achieving immediate phase-lock in a closed loop mode of operation.

At block 1108, the control logic 502 calculates Δε[m] and compensates for the calculated values by providing Δε[m] to accumulator 506, thereby adding Δε[m] to the reference phase signal φ$_r$[m]. With this adaptation immediate phase-lock is achieved in a closed loop mode of operation.

At block 1110, the ADPLL 304 updates and restores the state with the calculated compensation Δε[m]. In one embodiment, the ADPLL 304 updates and restores the digital tuning word for the second frequency band, thereby accommodating the calculated error, so the next time the ADPLL hops to the second frequency band, the updated digital tuning word is more accurate.

CONCLUSION

Although the subject matter has been described in language specific to structural features and/or methodological acts, it is to be understood that the subject matter defined in the appended claims is not necessarily limited to the specific features or acts described. Rather, the specific features and acts are disclosed as preferred forms of implementing the claims.

The invention claimed is:

1. An all digital phase-lock loop (ADPLL) circuit configured to:
   generate, using a digitally controlled oscillator (DCO), a variable frequency signal based on a reference frequency and a frequency command word, the frequency command word comprising an input to the ADPLL;
   use control logic to determine the tuning word and the frequency command word corresponding to a particular frequency band;
   determine an error generated by the DCO, the DCO operated using a tuning word;
   store information related to the error; and
   compensate for the error based on the stored information.

2. The ADPLL of claim 1, wherein the compensation is performed digitally in a closed loop mode of operation.

3. The ADPLL of claim 2 further configured to perform one cycle in an open loop mode of operation prior to the digital compensation performed in the closed loop mode of operation to accommodate transient behavior associated with the DCO.

4. The ADPLL of claim 2, wherein the tuning word corresponds to a first state of the ADPLL, and wherein the ADPLL is configured to update the tuning word corresponding to a second state of the ADPLL, the tuning word being updated to accommodate the digitally compensated error.

5. The ADPLL of claim 4, wherein the first state of the ADPLL and the second state of the ADPLL correspond to a same frequency band.

6. The ADPLL of claim 2, wherein the tuning word is stored in a system memory and determined by the control logic via a look-up table.

7. The ADPLL of claim 1, wherein the error is introduced when changing from a first frequency to a second frequency, and the stored information comprises a retiming value associated with the error.

8. A system that includes the ADPLL of claim 1, the system used in wireless communications comprising frequency hopping.

9. A method for achieving phase lock using an all digital phase lock loop (ADPLL) comprising:
   determining a command word based on a desired frequency band;
   defining an output of the ADPLL based on the command word and a reference frequency;
   determining a tuning word based on the desired frequency band;
   operating a digitally controlled oscillator (DCO) using the tuning word, the output of the ADPLL comprising an output of the DCO;
   determining an error introduced by the DCO;
   compensating for the error in a closed loop mode of operation; and
   performing an open loop mode of operation cycle in the ADPLL prior to compensating for the error in the closed loop mode of operation, wherein the open loop mode of operation cycle accommodates transient behavior associated with the DCO.

10. The method of claim 9, wherein the error is digitally calculated and the compensating is digitally performed.

11. The method of claim 10, wherein the tuning word corresponds to a first state of the ADPLL, and wherein the ADPLL is configured to update the tuning word corresponding to a second state of the ADPLL, the tuning word being updated to accommodate the digitally compensated error.

12. The method of claim 11, wherein the first state of the ADPLL and the second state of the ADPLL correspond to a same frequency band.

13. The method of claim 10, wherein the error is introduced when changing from a first frequency to a second frequency.

14. The method of claim 13, wherein determining the error comprises measuring a retiming error during a portion of a first closed loop cycle at the second frequency.

* * * * *